US008743536B2

(12) United States Patent
Alo et al.

(10) Patent No.: US 8,743,536 B2
(45) Date of Patent: Jun. 3, 2014

(54) MECHANICAL CONVERSION SLEEVE

(75) Inventors: Roland Kamakau Alo, Raleigh, NC (US); William Beauchamp, Raleigh, NC (US); Timothy Andreas Meserth, Durham, NC (US); Walter Adrian Goodman, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 439 days.

(21) Appl. No.: 13/115,059

(22) Filed: May 24, 2011

(65) Prior Publication Data

US 2012/0300384 A1 Nov. 29, 2012

(51) Int. Cl.
*G06F 1/16* (2006.01)
*G06F 1/18* (2006.01)

(52) U.S. Cl.
CPC .................................... *G06F 1/187* (2013.01)
USPC ...................................... 361/679.33; 361/816

(58) Field of Classification Search
CPC ................. H05K 2201/10378; H05K 1/0243; H05K 7/1069; H05K 2201/10424; G06F 1/187; G06F 1/182; G06F 1/185; G06F 1/189
USPC ............ 361/679.01, 679.02, 679.31–679.39, 361/724–727, 752, 796–800, 816, 818; 312/223.1–223.2
See application file for complete search history.

(56) References Cited

U.S. PATENT DOCUMENTS

| | | | |
|---|---|---|---|
| D374,216 S | 10/1996 | Paul | |
| 6,430,000 B1 | 8/2002 | Rent | |
| 7,362,565 B2 | 4/2008 | Imblum | |
| 7,420,801 B2 | 9/2008 | Behl | |
| 7,637,784 B2 * | 12/2009 | Evans | 439/638 |
| 7,679,899 B2 * | 3/2010 | Hsieh et al. | 361/679.38 |
| 7,808,777 B2 * | 10/2010 | Luo | 361/679.37 |
| 7,848,099 B1 * | 12/2010 | Zhang et al. | 361/679.38 |
| 7,855,880 B2 | 12/2010 | Moore | |
| 7,869,218 B2 | 1/2011 | Ni et al. | |
| 7,870,446 B2 | 1/2011 | Kurashige | |
| 8,369,081 B2 * | 2/2013 | Chen | 361/679.39 |
| 8,508,928 B2 * | 8/2013 | Killen et al. | 361/679.39 |

FOREIGN PATENT DOCUMENTS

| | | |
|---|---|---|
| GB | 2447516 A | 9/2008 |
| GB | 2447517 A | 9/2008 |

OTHER PUBLICATIONS

Addonics Technologies, "CF Hard Drive Addapter." Copyright 1998-2010. Date printed Apr. 26, 2011 <http://www.addonics.com/products/flash_memory_reader/ad44midecf.asp>.

(Continued)

*Primary Examiner* — Anthony Haughton
*Assistant Examiner* — Ingrid Wright
(74) *Attorney, Agent, or Firm* — Jason Sosa

(57) ABSTRACT

Embodiments disclose a conversion sleeve for connecting smaller form factor drives to a receptacle of a larger form factor drive. The conversion sleeve has an outer frame shaped to fit within the receptacle of the larger form factor drive. Within the conversion sleeve is at least one channel for receiving a smaller form factor drive. The smaller form factor drive is hot swappable. On a side of the conversion sleeve, a spring-locking mechanism is design to lock into an existing aperture of the receptacle. The conversion sleeve also includes an interposer to bring the smaller form factor drive to the receiving end of the conversion sleeve for easy access.

11 Claims, 5 Drawing Sheets

(56) References Cited

OTHER PUBLICATIONS

Addonics Technologies, "1.8" ZIF or 1.8" IDE 50-pin to 2.5" IDE connector converter kit (for Toshiba 1.8" hard drive)." Copyright 1998-2010. Date printed Apr. 26, 2011 <http://www.addonics.com/products/io/aaedt18ide25.asp>.

IBM Corporation. Lenovo. "Lenovo Support—Thinkpad 128GB Solid State Drive—Overview." IBM Corporation Copyright 2011. Lenovo Copyright 2011. Web page last modified Apr. 6, 2011. Date printed Apr. 26, 2011 <http://www-307.ibm.com/pc/support/site.wss/document.do?Indocid=MIGR-70903>.

TheSSD.com. "How to convert 1.8" SSD to 2.5, microSATA to SATA." Copyright 2011. Date printed Apr. 26, 2011 <http://thessd.com/how-to-convert-1-8-ssd-to-2-5-microsata-to-sata/>.

NEWMODEUS.com. "1.8-2.5" Drive Adapter 3.3v support (MicroSATA to SATA)Black". Copyright 2011. Date printed Apr. 26, 2011 <http://newmodeus.com/shop/index.php?main_page=product_info&cPath=2_35&products_id=300&zenid=33867f8b43ca2e8e8ed5b6ac592c3d02>.

U.S. Appl. No. 12/827,897, entitled "Externally Latching Drive Tray and Drive Removal Mechanism," filed Jun. 30, 2010.

U.S. Appl. No. 12/841,461, entitled "Externally Latching Drive Tray and Drive Removal Mechanism," filed Jul. 22, 2010.

* cited by examiner

MECHANICAL CONVERSION SLEEVE

BACKGROUND

This disclosure relates generally to the field of data storage management, and in particular, to the creation of a conversion sleeve for connecting a storage drive form factor of one size to an existing disk bay designed for a storage drive form factor of another size.

Replacing a computer system component without shutting down the system and without significant interruption to the system is known in the industry as "hot swapping." Hot swapping redundant hard drives is a critical feature for high-availability systems. As new technologies evolve, and as system density becomes more critical, smaller features and storage components that are just as robust as previous generations must be developed to protect the customers' data.

Traditionally, hard disk drive (HDD) form factors, such as the 3.5" drive and the 2.5" drive, are attached to a drive tray. A drive tray is a removable tray, allowing such drives to be swapped/replaced with ease. New storage drive technology, such as the 1.8" drive, does not have enough space to attach a drive tray. Alternate drive-removal mechanisms are being developed to allow the smaller form factor technology to be used as hot swappable drives.

The addition of smaller form factor drives has not replaced existing traditional disk drives. The traditional drives tend to cost less than the smaller form factor drives. In addition, though the smaller drives are often solid state drives (SSDs) with high IOPS (input/output operations per second), the magnetic storage disks of the larger form factors have a higher capacity. Many existing systems have arrays of disk bays for the traditional form factors (typically of the 2.5" type), but not disk bays for newer, smaller form factors. Replacing the existing systems to accommodate smaller form factors is a costly proposition, and developing systems that house separate disk bays for both the traditional and the smaller form factors is antithetical to the creation of high density systems.

SUMMARY

One aspect of the invention discloses an apparatus for receiving a storage drive of a first size for use in a computer comprising a bay to receive a storage drive of a second size. A first brace has first and second ends and a grooved channel extending from the first to end the second end. A second brace also has first and second ends and a grooved channel extending from the first end to the second end. An interposer is coupled to the second end of the first brace and to the second end of the second brace, the interposer has a first port operative to communicate with a storage device of the first size and a second port operative to communicate with a computer. Finally, an outer casing covers the first and second brace and the interposer. The outer casing has an open front end allowing access to the respective grooved channels of the first and second brace at the respective first ends of the first and second brace, and an open back end allowing access to the interposer.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which.

DETAILED DESCRIPTION

Detailed embodiments of the present invention are disclosed herein with reference to the accompanying drawings; however, it is to be understood that the disclosed embodiments are merely illustrative of potential embodiments of the invention and may take various forms. In addition, each of the examples given in connection with the various embodiments is also intended to be illustrative, and not restrictive. This description is intended to be interpreted merely as a representative basis for teaching one skilled in the art to variously employ the various aspects of the present disclosure. In the description, details of well-known features and techniques may be omitted to avoid unnecessarily obscuring the presented embodiments.

Embodiments of the invention provide a conversion sleeve with the capability of connecting a small form factor drive to a receptacle designed for a larger form factor drive, and doing so in a manner that allows the small form factor drive to be hot swappable.

Figure 1:
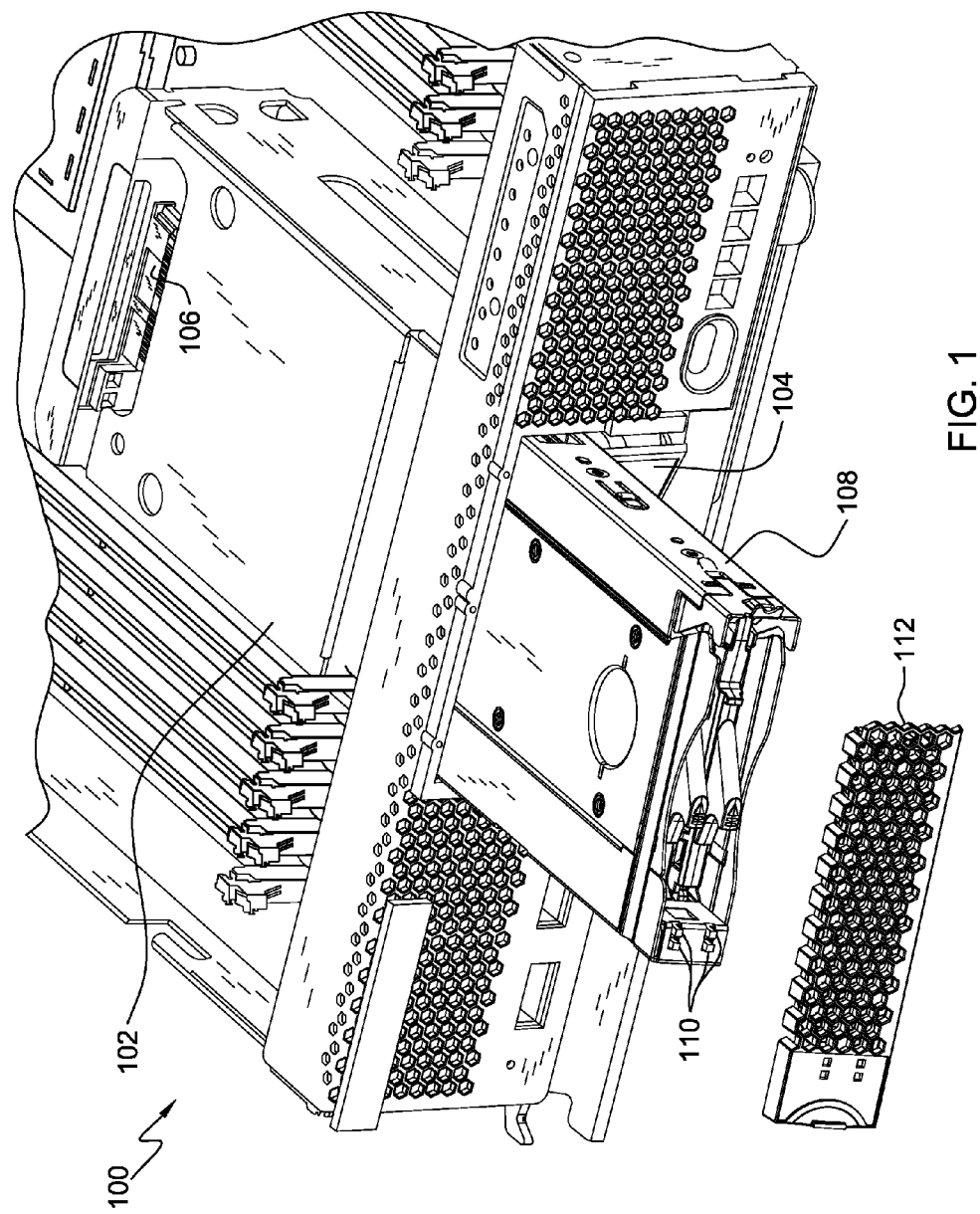
FIG. 1 depicts an illustrative diagram of a data processing system in which a conversion sleeve may be utilized.

FIG. 1 depicts an illustrative diagram of a data processing system in which a conversion sleeve may be utilized. Data processing system 100 comprises, in a most basic form, one or more processors, one or more computer-readable memories, and one or more computer-readable tangible storage devices. In this example, computer-readable tangible storage devices may be inserted into data processing system 100 through a two-bay hard drive disk (HDD) array 102 and logically connected to data processing system 100 through backplane 106. In this embodiment, disk array 102 is designed for 2.5" HDDs. Conversion sleeve 108 is designed to have the outer dimensions of a 2.5" form factor drive tray. Open disk bay 104 allows for a 2.5" form factor drive to be connected in parallel with conversion sleeve 108. Alternatively, a second conversion sleeve may be inserted into open disk bay 104. Other embodiments may have disk arrays with more disk bays.

The ability of conversion sleeve 108 to connect into a disk bay of a larger form factor has the advantage of allowing the smaller form factor drives (i.e., 1.8" SSD) to intermix with larger form factor drives (2.5" HHD) in the same disk array. This allows the use of the both types of drives without having to design systems with separate arrays for each storage/memory type.

Lightpipe array 110 transmits signaling indicative of the health of the connection between conversion sleeve 108 and backplane 106, or alternatively between conversion sleeve 108 and a small form factor drive inserted into conversion sleeve 108. In a preferred embodiment, conversion sleeve 108 is designed to receive two 1.8" drives. In alternative embodiments, conversion sleeve 108 may receive any number of drives, which may be any size drive smaller than the drive that disk array 102 is designed for.

Once conversion sleeve 108 is fully inserted into a bay of disk array 102, bezel 112 may cover the opening. Bezel 112 may also provide electromagnetic compatibility (EMC) shielding.

Figure 2:
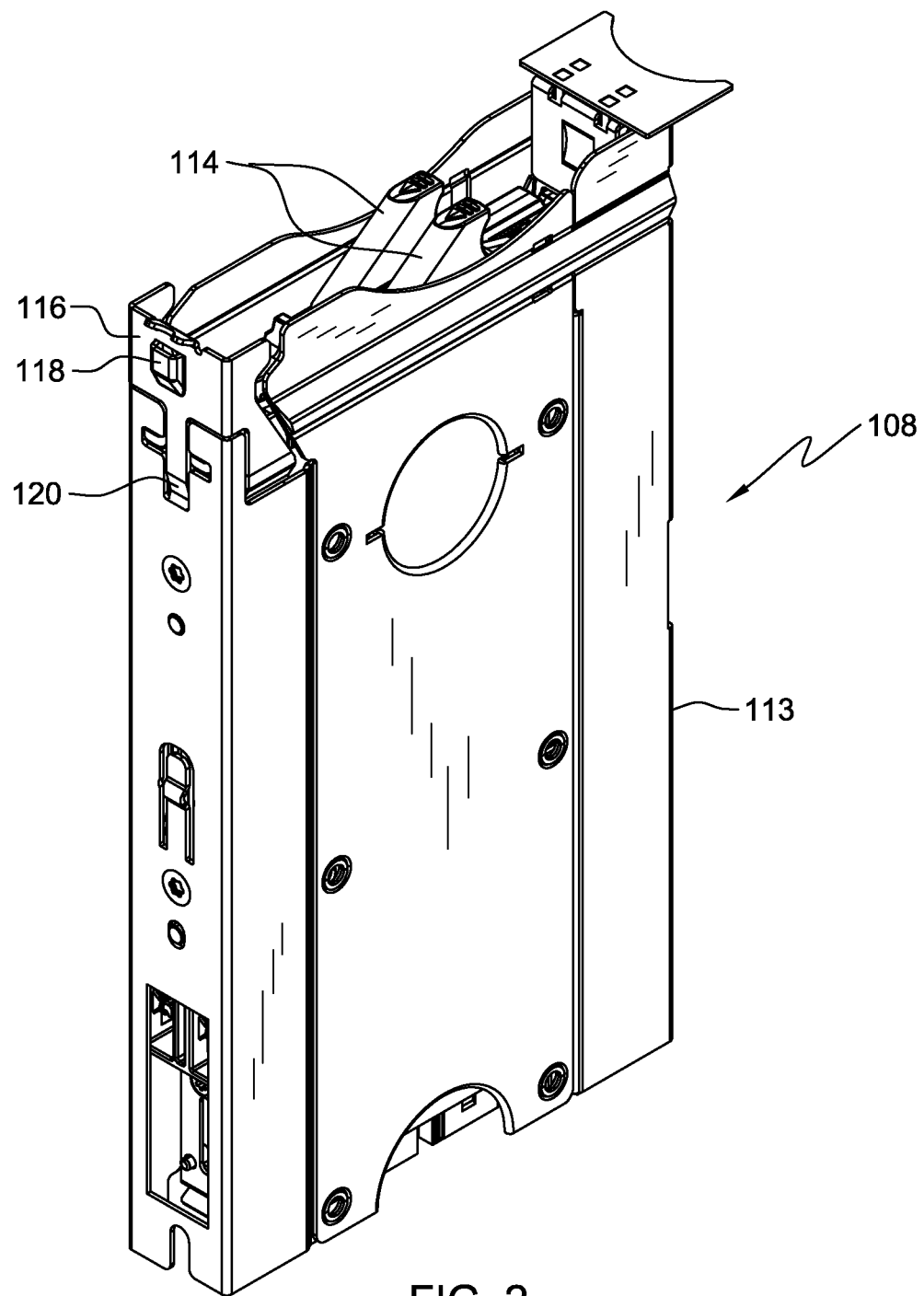
FIG. 2 illustrates an outer view of a conversion sleeve in accordance with an embodiment of the invention.

FIG. 2 illustrates an outer view of conversion sleeve 108 in accordance with an embodiment of the invention.

Conversion sleeve 108 comprises outer frame 113. In the depicted embodiment, outer frame 113 has dimensions such that outer frame 113 fits securely into a 2.5" drive bay. Outer frame 113 has openings at a front and back end. The opening at the front allows for the receipt of one or more smaller form factor drives, while the opening at the back end allows for a connection to a backplane. In a preferred embodiment, the opening at the back end would also allow access to one or more internal components of conversion sleeve 108. Outer frame 113 is preferably made up of two side brackets, a face plate and a back plate.

Latching arms 114 open to allow the insertion or removal of a 1.8" drive.

Spring-locking mechanism 116 secures conversion sleeve 108 into a drive bay when completely inserted. In one embodiment, spring-locking mechanism 116 is a small plate connected to the front end of a side of conversion sleeve 108. Retention latch 118 is a small protrusion on the plate. Spring-locking mechanism 116 is connected on an axis so that the outermost end may rotate inward towards the front end of conversion sleeve 108. Lever 120 is bent away from conversion sleeve 108 and covered by outer frame 113. Covering the bent (or folded) end of the lever 120 exerts pressure on the whole of lever 120, providing a spring force that biases the spring-locking mechanism 116 to rest flat with the side of conversion sleeve 108. In another embodiment a spring may placed on the inside of spring-locking mechanism 116 to provide an outward bias.

An existing feature of a current drive bay is a square aperture along an edge where the cam handle of a drive tray can latch into. Retention latch 118 corresponds to the existing aperture and fits within it. In a preferred embodiment, retention latch 118 is tapered towards the back end (the insertion end) so that as conversion sleeve 108 is inserted into the drive bay, spring-locking mechanism 116 is forced inward until retention latch 118 aligns with the existing aperture. The spring force applied by lever 120 draws the retention latch into the aperture to lock conversion sleeve 108 in place. Conversion sleeve 108 may be released by applying inward pressure to spring-locking mechanism 116 to disengage retention latch 118.

Figure 3:
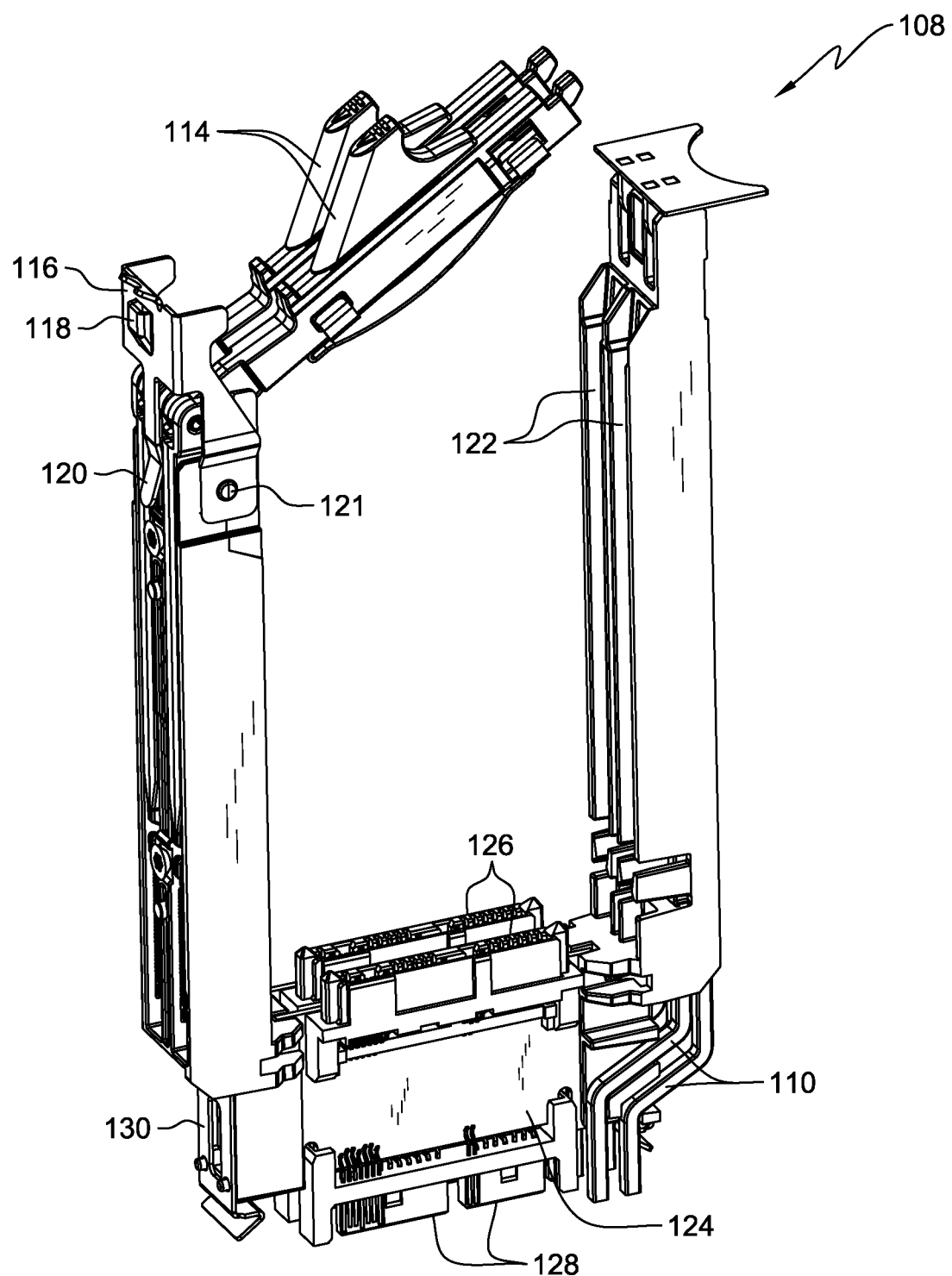
FIG. 3 depicts the internal components of a conversion sleeve in accordance with an illustrative embodiment.

FIG. 3 depicts the internal components of conversion sleeve 108 in accordance with an illustrative embodiment.

Latching arms 114 rotate around an axis to allow access to channels 122. Channels 122 can each receive a storage device, such as a 1.8" SSD drive. Once the storage device is inserted, a latching arm 114 may be closed to keep the storage device secure. A slide release on latching arm 114 unlocks the latching arm and allows the storage device to be removed without tools and during runtime. In a preferred embodiment, after latching arm 114 rotates open, latching arm 114 may be pulled forward to eject the storage device. An extension spring may bring latching arm 114 back to a resting state. Drive removal mechanisms for smaller form factor drives such as this are being developed and are known in the art. In another embodiment, conversion sleeve 108 contains only one latching arm 114 and one channel 122.

Here again, spring-locking mechanism 116 with retention latch 118 and lever 120 are shown. Connection point 121 of spring-locking mechanism 116 can be seen in this depiction. Connection point 121, in addition to securing spring-locking mechanism to conversion sleeve 108, also provides the axis of rotation for spring-locking mechanism 116 allowing it rotate inward.

A smaller form factor drive inserted into conversion sleeve 108 is not as long as the form factor drive that the drive bay is designed for. To bring the smaller drive forward for accessibility, interposer 124 (an interposed connector) is used to bridge the gap. Interposer 124 contains electrical interconnects 126 which are configured to connect to electrical interconnects of the smaller form factor drive when the drive is fully inserted into conversion sleeve 108. Interposer 124 contains circuitry to relay electrical signals from electrical interconnects 126 to and from electrical interconnects 128, which in turn connect to electrical interconnects on a backplane.

Spring retention housing 130 secures interposer 124 and ensures that when conversion sleeve 108 is fully inserted into the drive bay, electrical interconnects 128 are properly seated against the electrical interconnects of the backplane.

Figure 4A:
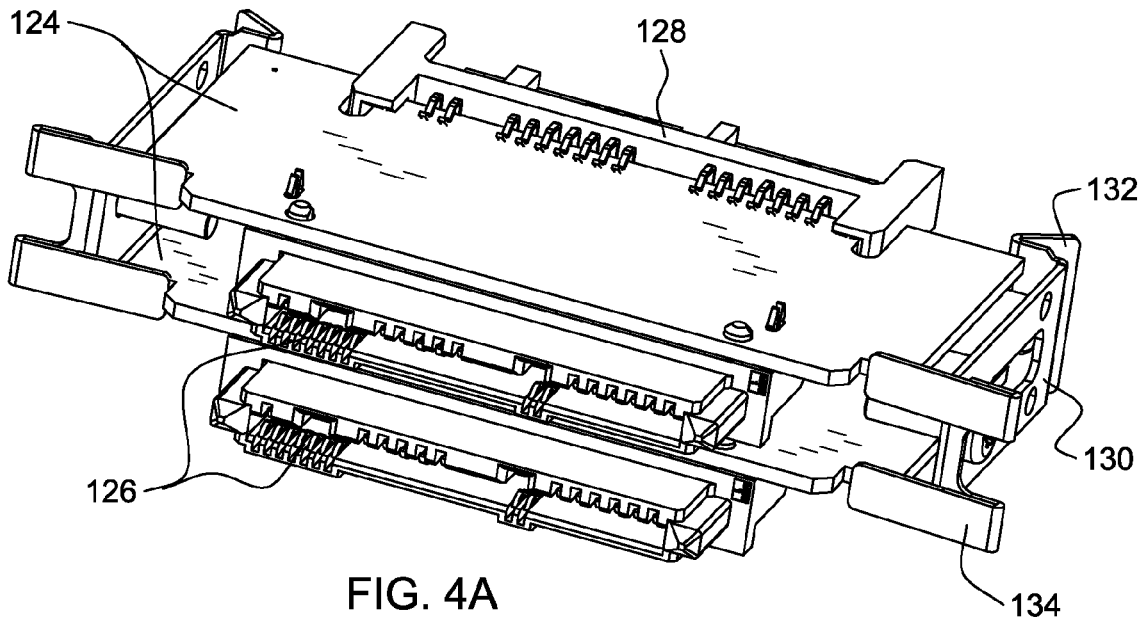
FIG. 4A illustrates an interposer and spring retention housing in accordance with an embodiment of the invention.
Figure 4B:
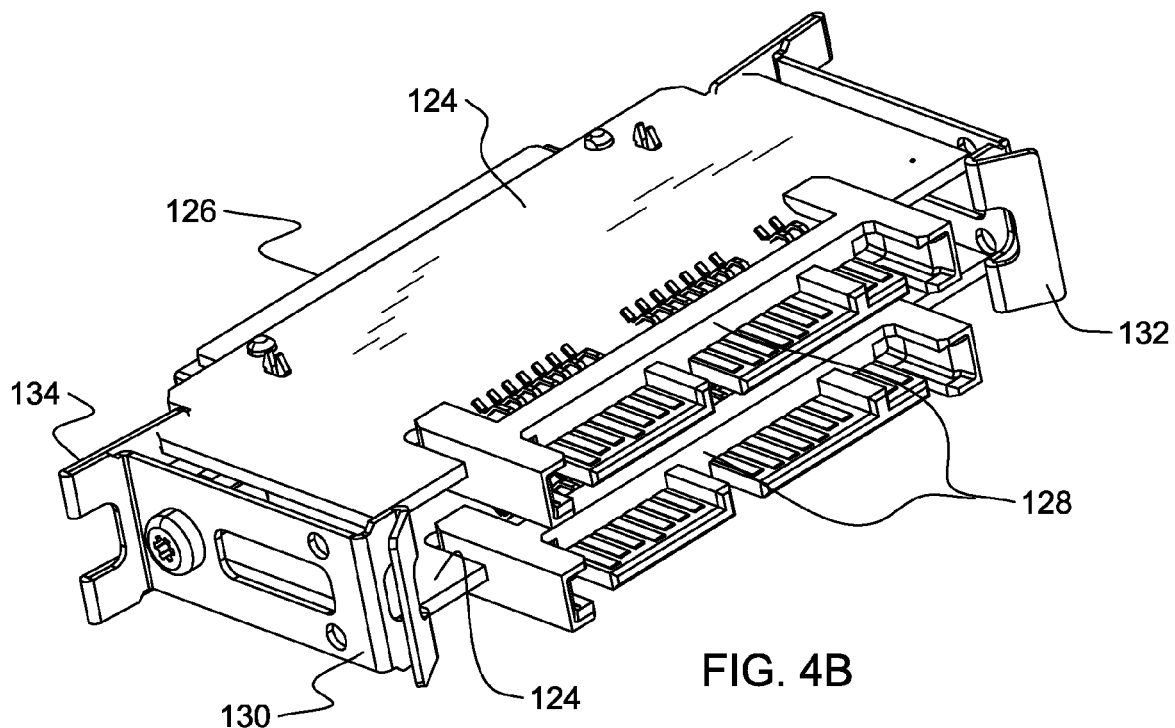
FIG. 4B depicts an alternate angle of the interposer and spring retention housing of FIG. 4A.

FIGS. 4A and 4B illustrate alternate angles of interposers 124 and spring retention housing 130 in accordance with an embodiment of the invention. As the same components are displayed in each of the figures, the discussion of FIGS. 4A and 4B takes place simultaneously.

In the preferred embodiment, there are two interposers 124. In other embodiments there may only one interposer 124 or a number greater than two. Electrical interconnects 126 are designed to connect to the electrical interconnects of a smaller drive, while electrical interconnects 128 are designed to connect to a port on a backplane. In a preferred embodiment, the port on the backplane would be designed to receive the smaller drive. In such an embodiment, electrical interconnects 128 are of the same type as the electrical interconnects of the smaller drive. In the depicted embodiment, interposer 124 is a circuit card acting as spacer and relaying signals from interconnect 126 to interconnect 128 and back again. It is envisioned that the backplane would be altered to have the proper electrical interconnects corresponding to interposers 124 of conversion sleeve 108.

In an embodiment where there is only one interposer 124 and an unaltered backplane is used (i.e., a backplane designed for a disk array containing all the same type of memory devices), interposer 124 may be a conversion card where interconnect 126 connects to the interconnect of a smaller drive and interconnect 128 connects to a port designed for the larger drive. Conversion cards are known in the art.

Attached to the back end (the insertion end) of conversion sleeve 108 is spring retention housing 130. Spring retention housing 130 contains a plate on each side to hold interposers 124. Spring retention housing 130 is designed to receive interposers 124 from the opening in the back end of conversion sleeve 108.

Interposers 124 may be inserted and removed from the conversion sleeve without tools. This is accomplished by the use of clip 132. Clip 132 is a fold in a back end of each plate, nearest the back end of conversion sleeve 108 where interposers 124 are inserted. Pressure applied to clip 132 allows the opening to widen so that interposers 124 may be inserted or removed. When the pressure is removed, clip 132 is biased to return to its original position, forming a back stop behind interposers 124.

On the opposite end of clip 132 is spring stop 134. Spring stop 134 involves the front end of each side plate being folded. In this instance, the plate is first folded outward and then inward so that it is substantially orthogonal to the rest of the plate, and biased to remain this way. When interposers 124 are inserted into spring retention housing 130, interposers 124 push against spring stop 134 to clear clip 132. The bias towards the back end, caused by spring stop 134, pushes interposers 124 tight against the back stop formed by clip 132. This avoids tolerance build-up (the slight variations of sizes) and allows for a tight seat against the back end and a solid connection with backplane when conversion sleeve 108 is fully inserted into a disk bay.

Figure 5A:
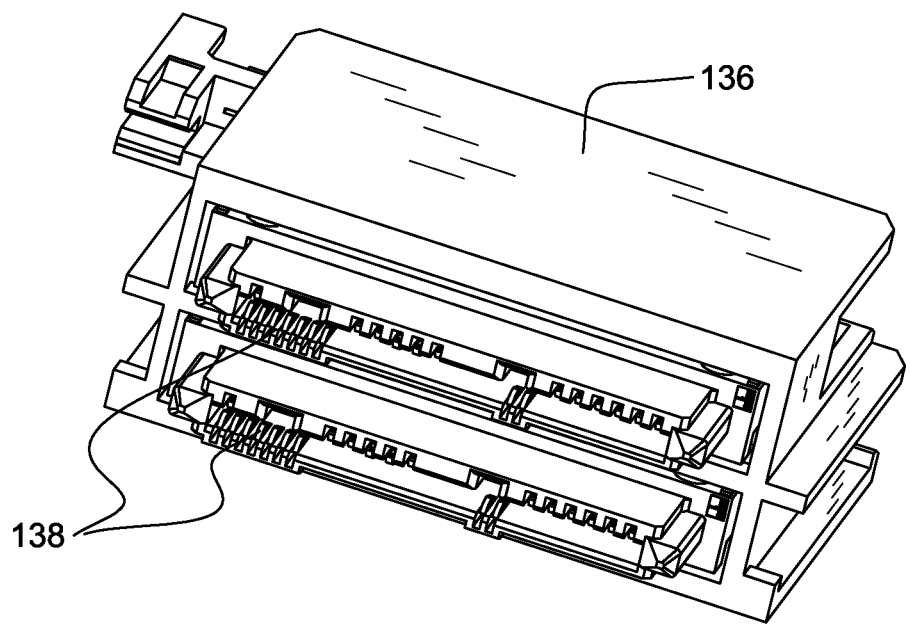
FIG. 5A illustrates an alternate interposer in accordance with an embodiment of the invention.
Figure 5B:
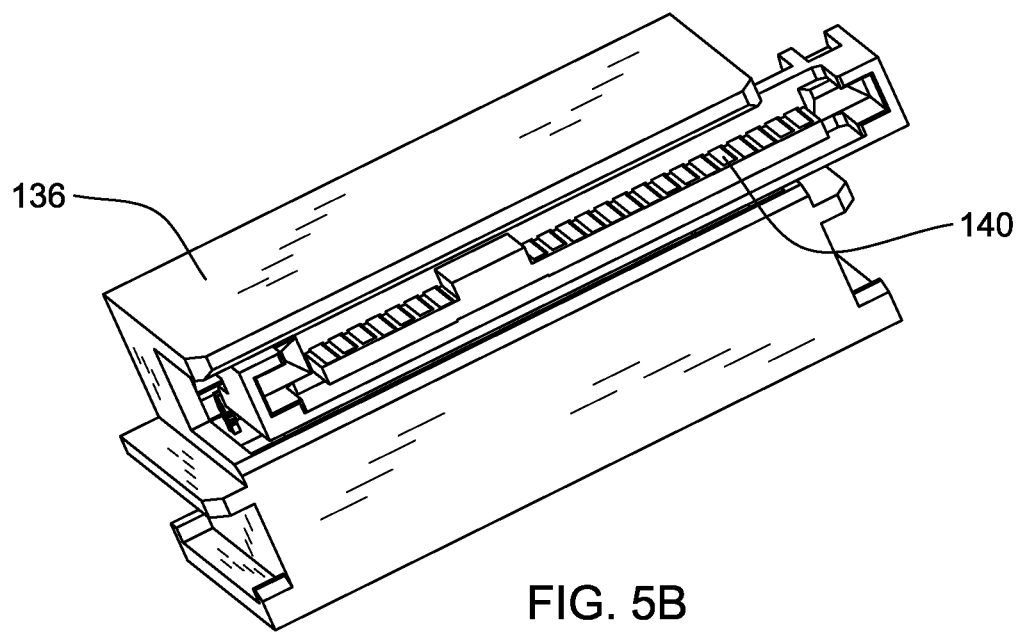
FIG. 5B depicts and an alternate view of the alternate interposer of FIG. 5A.

FIGS. 5A and 5B depict various angles of an alternate interposer 136 in accordance with an embodiment of the invention. As the same components are displayed in each of the figures, the discussion of FIGS. 5A and 5B takes place simultaneously.

Alternate interposer 136 is a single connector that may connect to multiple smaller drives. In a preferred embodiment, alternate interposer 136 is a plastic housing having two electrical interconnects 138 for connecting to electrical interconnects of two smaller drives (i.e., two 1.8" SSD). On the opposite end of alternate interposer 136, electrical interconnect 140 is designed to connect to a port on a backplane designed for a larger drive (i.e., a 2.5" HDD).

Alternate interposer 136 allows a multitude of the smaller drives to be accessed as a single drive. Alternate interposer 136 also includes the internal circuitry for conversion to a larger drive's port. In this embodiment, a backplane with only the standard connections for the larger drives may be used.

The terminology used herein is for the purpose of describing particular embodiments only and is not intended to be limiting of the invention. As used herein, the singular forms "a", "an" and "the" are intended to include the plural forms as well, unless the context clearly indicates otherwise.

Having described preferred embodiments of a mechanical conversion sleeve (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. An apparatus for receiving a storage device of a first size for use in a computer comprising a bay to receive a storage device of a second size, the apparatus comprising: a first side having first and second ends and a grooved channel extending from the first end of the first side to the second end of the first side; a second side having first and second ends and a grooved channel extending from the first end of the second side to the second end of the second side; an interposer coupled to the second end of the first side and to the second end of the second side, the interposer having a first communications port and a second communications port, the first communications port, when connected to a storage device of a first size engaged with the grooved channel of the first side and the grooved channel of the second side, being operative to communicate with the storage device of the first size, and the second communications port, when connected to a computer comprising a bay for receiving a storage device of a second size, being operative to communicate with the computer; an outer casing disposed over and at least partially covering the first and second sides;

a spring-retention housing for securing the interposer, the spring-retention housing comprising: a first side plate with a front and back end, the front end of the first side plate connected to the second end of the first side, and a second side plate with a front and back end, the front end of the second side plate connected to the second end of the second side, wherein the first and second side plates are spaced to allow the interposer to fit between them and wherein the respective back ends of each of the first and second side plate, are accessible through the outer casing; a clip at each respective back end of the first and second side plate that flexes outward under an outward pressure to allow the interposer to be inserted or removed and returns to an original position after the outward pressure is removed, wherein the original position provides a back stop to secure the interposer when inserted; and a front stop at the respective front ends of the first and second side plates, preventing the interposer from being inserted past the front end, wherein the front stop provides a spring force towards the respective back ends to hold the interposer flush against the back stop after being inserted into the spring retention housing; and a connector plate coupled to the first side of the apparatus to connect the apparatus to a side of the bay of the computer.

2. The present application is being examined under the pre-AIA first to invent provisions.

3. The apparatus of claim 1, wherein the connector plate comprises:
   a plate pivotally connected to the first side; and
   a raised protrusion on the plate corresponding to an aperture in the bay of the computer.

4. The apparatus of claim 3, wherein the connector plate further comprises a lever extending from the plate along an outer side of the first side and underneath the outer casing, to provide a spring force biasing the plate to rest flat with a side of the outer casing when the plate is pivotally rotated toward the second side.

5. The apparatus of claim 3, wherein the raised protrusion tapers toward the second end of the first side to compel the plate to pivot when inserted into the bay.

6. The apparatus of claim 1, wherein the interposer is of a length such that an end of the storage device of the first size is at the respective first ends of the first and second sides.

7. The apparatus of claim 1, wherein the interposer is a circuit card.

8. The apparatus of claim 1, wherein the interposer further comprises a third communications port connected to the same side as the first communications port, the third communications port, when connected to another storage device of the first size, being operative to communicate with the other storage device of the first size.

9. The apparatus of claim 1, wherein the second port of the interposer is adapted to connect to a backplane of the computer, where the backplane has a port for receiving the storage device of the second size.

10. The apparatus of claim 1, wherein a storage device of the first size is a 1.8 inch form factor storage drive and a storage device of the second size is a 2.5 inch form factor storage drive.

11. An apparatus for receiving a storage device of a first size for use in a computer comprising a bay to receive a storage device of a second size, the apparatus comprising:
   a first side having first and second ends and a grooved channel extending from the first end of the first side to the second end of the first side;
   a second side having first and second ends and a grooved channel extending from the first end of the second side to the second end of the second side;
   a spring-retention housing securing an interposer, the spring-retention housing having:
      a first side plate with a front and back end, the front end of the first side plate connected to the second end of the first side, and a second side plate with a front and back end, the front end of the second side plate connected to the second end of the second side, wherein the first and second side plates are spaced to allow the interposer to fit between them;

a clip at each respective back end of the first and second side plate that flexes outward under an outward pressure to allow the interposer to be inserted or removed and returns to an original position after the outward pressure is removed, wherein the original position provides a back stop to secure the interposer when inserted; and a front stop at the respective front ends of the first and second side plates, preventing the interposer from being inserted past the front end, wherein the front stop provides a spring force towards the respective back ends to hold the interposer flush against the back stop after being inserted into the spring retention housing;

the interposer having a first communications port and a second communications port, the first communications port, when connected to a storage device of a first size engaged with the grooved channel of the first side and the grooved channel of the second side, being operative to communicate with the storage device of the first size, and the second communications port, when connected to a computer comprising a bay for receiving a storage device of a second size, being operative to communicate with the computer; and an outer casing disposed over and at least partially covering the first and second sides.

\* \* \* \* \*